US011088062B2

(12) United States Patent
Feng et al.

(10) Patent No.: US 11,088,062 B2
(45) Date of Patent: Aug. 10, 2021

(54) METHOD TO ENABLE 30 MICRONS PITCH EMIB OR BELOW

(71) Applicant: Intel Corporation, Santa Clara, CA (US)

(72) Inventors: Hongxia Feng, Chandler, AZ (US); Dingying David Xu, Chandler, AZ (US); Sheng C. Li, Gilbert, AZ (US); Matthew L. Tingey, Hillsboro, OR (US); Meizi Jiao, Chandler, AZ (US); Chung Kwang Christopher Tan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 15/654,399

(22) Filed: Jul. 19, 2017

(65) Prior Publication Data
US 2019/0027431 A1    Jan. 24, 2019

(51) Int. Cl.
| *H01L 23/498* | (2006.01) |
| *H01L 23/13* | (2006.01) |
| *H01L 21/48* | (2006.01) |
| *H01L 23/538* | (2006.01) |

(52) U.S. Cl.
CPC ...... *H01L 23/49838* (2013.01); *H01L 21/486* (2013.01); *H01L 21/4857* (2013.01); *H01L 23/13* (2013.01); *H01L 23/49822* (2013.01); *H01L 23/49866* (2013.01); *H01L 23/5385* (2013.01); *H01L 23/49816* (2013.01);
(Continued)

(58) Field of Classification Search
CPC ............ H01L 23/5385; H01L 23/5384; H01L 23/49822; H01L 23/49827; H01L 23/5383–5385; H01L 2224/16155–16168; H01L 2224/16225–1624; H01L 2224/24225–24227; H01L 2224/32225–3224; H01L 2224/24155; H01L 2224/32155–32168; H01L 23/49833
See application file for complete search history.

(56) References Cited

U.S. PATENT DOCUMENTS

| 2016/0066423 | A1* | 3/2016 | Sakamoto | H05K 1/02 174/261 |
| 2018/0337130 | A1* | 11/2018 | Chang Chien | H01L 21/6835 |

* cited by examiner

*Primary Examiner* — Nelson Garces
(74) *Attorney, Agent, or Firm* — Schwabe, Williamson & Wyatt, P.C.

(57) ABSTRACT

A package substrate and package assembly including a package substrate including a substrate body including electrical routing features therein and a surface layer and a plurality of first and second contact points on the surface layer including a first pitch and a second pitch, respectively, wherein the plurality of first contact points and the plurality of second contact points are continuous posts to the respective ones of the electrical routing features. A method including forming first conductive vias in a package assembly, wherein the first conductive vias include substrate conductive vias to electrical routing features in a package substrate and bridge conductive vias to bridge surface routing features of a bridge substrate; forming a first surface layer and a second surface layer on the package substrate; and forming
(Continued)

second conductive vias through each of the first surface layer and the second surface layer to the bridge conductive vias.

14 Claims, 4 Drawing Sheets

(52) U.S. Cl.
CPC .............................. *H01L 23/5383* (2013.01); *H01L 2224/16225* (2013.01); *H01L 2924/15311* (2013.01)

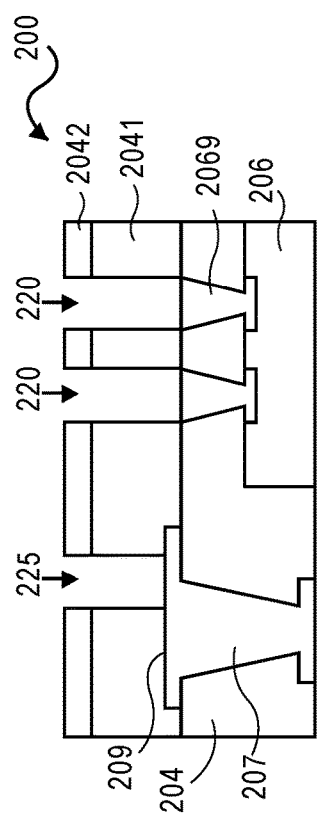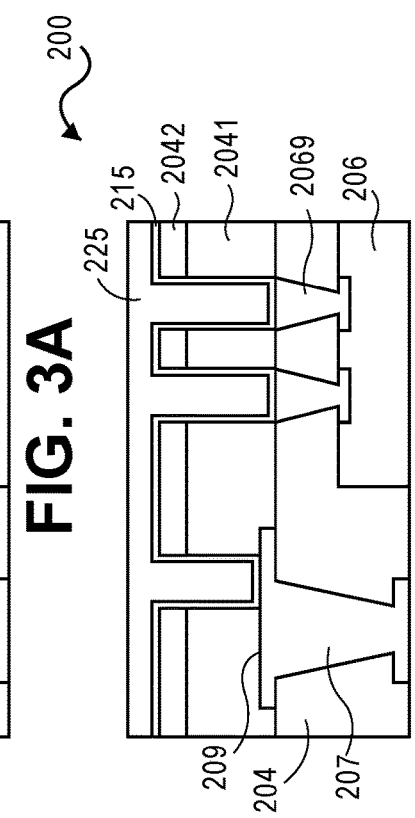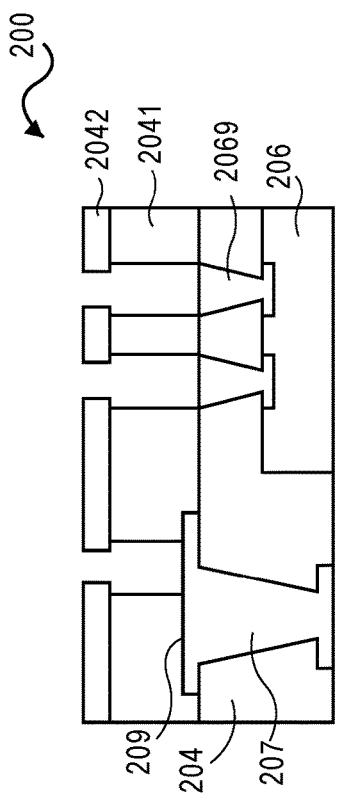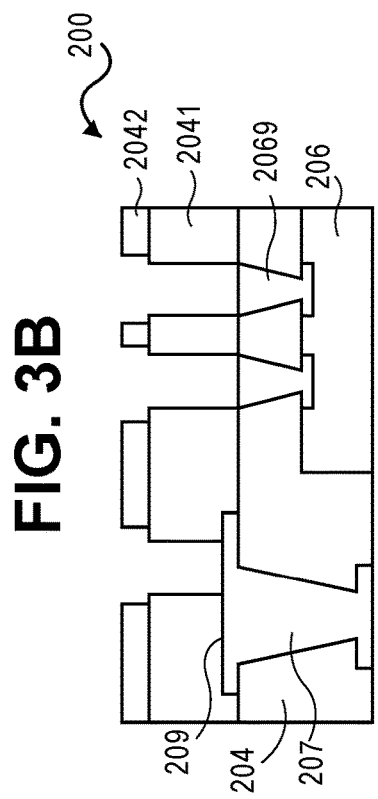

METHOD TO ENABLE 30 MICRONS PITCH EMIB OR BELOW

FIELD

Integrated circuits, and more particularly, to package assemblies.

BACKGROUND

Integrated circuit (IC) product architecture often incorporates a number of heterogeneous functions such as central processing unit (CPU) logic, graphics functions, cache memory and other system functions to create integrated system-on-chip (SOC) designs, which may lower product design complexity and number of components for each product. Previously, products may have required that an end customer design a system board using separate packages for the different functions, which may increase a system board area, power loss, and, thus, cost of an integrated solution.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 3A shows the structure of FIG. 2 following the deposition of first and second surface layers on the package substrate and the forming of openings through the first and second surface layers to expose conductive pads and bridge conductive vias.

FIG. 3B shows the structure of FIG. 2 according to another embodiment where the second surface layer has a slightly negative etch angle response relative to the first surface layer so the dimension of the opening through the second surface layer is less than the dimension of the opening through the first surface layer.

FIG. 3C shows the structure of FIG. 2 according to another embodiment where the second surface layer has a slightly positive etch angle response relative to the first surface layer so the dimension of the opening through the second surface layer is greater than the dimension of the opening through the first surface layer.

FIG. 4 shows the structure of FIG. 3A (or FIG. 3B or FIG. 3C) following the deposition of an electrically conductive material on the structure.

FIG. 5 shows the structure of FIG. 4 following the planarizing of the surface of the structure and the removal of the second surface layer.

DETAILED DESCRIPTION

Figure 1:
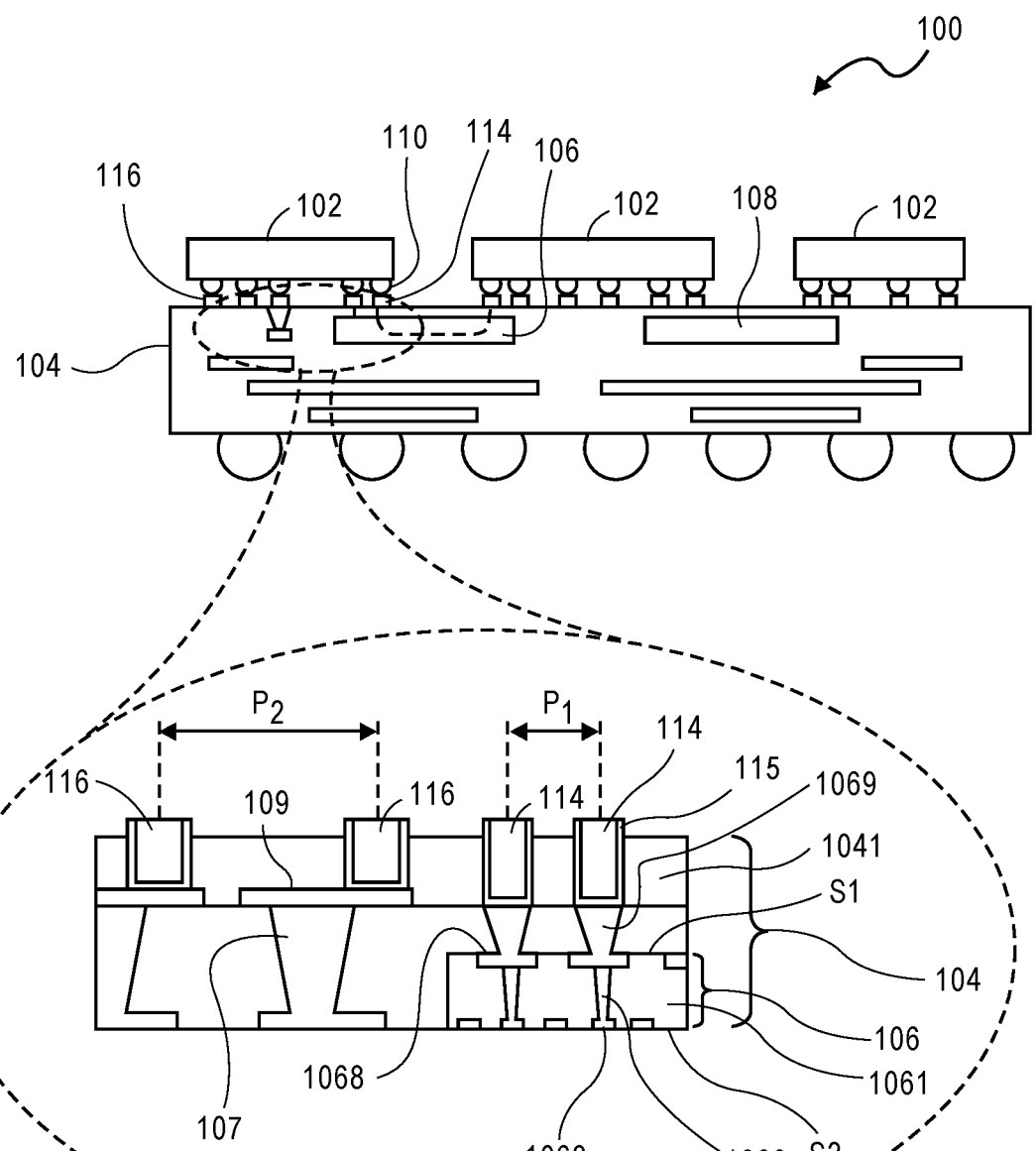
FIG. 1 schematically illustrates a cross-section side view of an embodiment of an integrated circuit (IC) package assembly including an embedded bridge interconnect assembly.

Embodiments of the disclosure describe techniques and configurations for a package assembly including, but not limited to a package substrate including at least one embedded bridge.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the disclosure, the phrase "A and/or B" means (A), (B), or (A and B). For the purposes of the disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, a phrase such as "a second layer formed, deposited, or otherwise disposed on a first layer," may mean that the second layer is formed, deposited, or disposed over the first layer, and at least a part of the second layer may be in direct contact (e.g., direct physical and/or electrical contact) or indirect contact (e.g., having one or more other layers between the first layer and the second layer) with at least a part of the first layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an embodiment of an integrated circuit (IC) package assembly 100 including embedded bridge interconnect assemblies (hereinafter "bridge 106" or "bridge 108"). In this embodiment, package assembly 100 includes package substrate 104 having a plurality (e.g., two or more) dies 102 mounted on a surface of package substrate 104 (a top surface as viewed). Package substrate 104, in one embodiment, includes an epoxy-based laminate substrate or body having a core and/or build-up layers such as, for example, an Ajinomoto Build-up Film (ABF) substrate. Package substrate 104 may include other suitable types of substrates in other embodiments.

Dies 102 may be, include, or be a part of a processor, memory, or application specific integrated circuit (ASIC) in some embodiments. Each of dies 102 may represent a discrete chip. Dies 102 can be attached to package substrate 104 according to a variety of suitable configurations including, a flip-chip configuration, as depicted, or other configurations such as wirebonding and the like. In the flip-chip configuration, an active side of dies 102 is attached to a surface of package substrate 104 (a top surface as viewed) using die interconnect structures 110 such as bumps or pillars.

Die interconnect structures 110 may be configured to route electrical signals between dies 102 and package substrate 104. In some embodiments, die interconnect structures 110 may be configured to route electrical signals such as, for example, input/output (I/O) signals and/or power or ground signals associated with the operation of dies 102.

Package substrate 104 includes electrical routing features configured to route electrical signals to or from the dies 102. The electrical routing features may be internal and/or external to the bridge 106 or 108. In one embodiment, package substrate 104 includes electrical routing features such as external contact points (e.g., pads) configured to receive die interconnect structures 110 and route electrical signals to or from dies 102. FIG. 1 shows contact points 114 and contact points 116. Contact points 114 are associated with bridge 106 or bridge 108 (e.g., vias and traces to or from bridge 106 and bridge 108 are connected to contact points 114). In one embodiment, contact points 114 are configured to route input/output (I/O) signals between dies 102 and bridge 106 and bridge 108. Contact points 116 are associated with the body of package substrate 104 (e.g., vias and traces that run through the body of package substrate 104). In one embodiment, contact points 116 are configured to route power and ground signals between package substrate 104 and dies 102. Package substrate 104 further includes package level interconnects 112 such as, for example, solder balls, connected to a surface of the package substrate 104 (a backside surface as viewed) to further route electrical signals to other electrical devices (e.g., motherboard or other chipset).

Dies 102 are electrically connected to bridge 106 or 108 through an electrically conductive connection between ones of die interconnect structures 110 and contact points 114. In one embodiment, bridge 106 or 108 is configured to route electrical signals between the dies 102. Bridge 106 or 108 may be a dense interconnect structure that provides a route for electrical signals such as I/O signals. Bridge 106 or 108 may include a bridge substrate composed of glass or a semiconductor material (e.g., high resistivity silicon) having electrical routing features formed thereon to provide a chip-to-chip connection between dies 102. Bridge 106 or 108 may be composed of other suitable materials in other embodiments. Bridges 106, 108, in one embodiment, are embedded in a cavity or cavities of package substrate 104. In some embodiments, a portion of dies 102 may overly the embedded bridge 106 or 108.

Although three dies 102 and two bridges 106, 108 are depicted in connection with FIG. 1, other embodiments may include more or fewer dies and bridges connected together in other possible configurations including three-dimensional configurations. For example, another die that is disposed on package substrate 104 in or out of the page relative to the dies 102 of FIG. 1 may be connected to dies 102 using bridge 106 or bridge 108 or another bridge.

An inset of FIG. 1 shows a magnified view of a portion of package substrate 104. Package substrate 104 includes a substrate body including surface layer 1041 defining a superior surface of the substrate body. Surface layer 1041, in one embodiment, is a dielectric material such as solder resist or other photoimageable dielectric material. The inset shows bridge 106 embedded in the substrate body of package substrate 104. Bridge 106 includes bridge substrate 1061, which may be composed of a high resistivity/low conductivity material such as, for example, glass or semiconductor material such as silicon. One or more electrical routing features may be formed on and through bridge substrate 1061. In some embodiments, one or more through hole vias (THVs) 1066 are formed through bridge substrate 1061 to provide an electrical pathway between opposing surfaces (top and bottom surfaces as viewed) of bridge substrate 1061. In an embodiment where bridge substrate 1061 is composed of glass, the one or more THVs 1066 may be through glass vias (TGVs) and in an embodiment where the bridge substrate 1061 is composed of silicon, the one or more THVs 1066 may be through silicon vias (TSVs). In embodiments where bridge substrate 1061 is composed of low temperature co-fired ceramic (LTCC), THVs 1066 may be through ceramic vias (TCVs).

Bridge 106 includes electrical routing features such as, for example, pads or traces and the like (referred to generally as "bridge surface routing features 1068") that may be formed on the opposing surfaces of bridge substrate 1061 to route electrical signals between dies (e.g., dies 102) on package substrate 104. For example, the surface routing features 1068 may be electrically connected with package routing features formed in package substrate 104 such as, for example, vias 1069 or other routing structure such as trenches or traces. The package routing features (e.g., vias 1069), in one embodiment, are configured to be electrically connected with the dies (e.g., dies 102). Surface routing features 1068 on surface S1 may be electrically connected with one or more through hole vias (THVs) 1066 to route electrical signals sent between dies 102 through vias 1069 over THVs 1066 to surface routing features 1068 formed on surface S2 of bridge substrate 1061.

Referring to the inset of FIG. 1, package substrate 104 includes contact points 114. In one embodiment, contact points 114 are continuous posts or pillars of an electrically conductive material (e.g., copper) having a top or superior surface available for an electrically conductive connection with die interconnect structures 110 of dies 102. Contact points 114 are continuous posts or pillars in the sense that the body of electrically conductive material extends in a generally similar cross-section between vias 1069 in package substrate 104 and a top or superior surface of the contact points. In one embodiment, contact points 114 are a copper material formed by electroplating. In such case, seed material 115 of, for example a copper material line openings in surface layer 1041 to facilitate electroplating. In such case, a "continuous" post or pillar includes any seed material that may have been or might be present, for example, on a surface of vias 1069. In another embodiment, a material for contact points 114 is nickel that may be formed by an electroless deposition process.

In one embodiment, contact points 114 of package substrate 104 have a pitch, $P_1$, that is on the order of 50 microns (μm) or less, such as 40 μm, 30 μm or 20 μm. Generally speaking, a density of contact points 114 dictates a communication rate for I/O type connections. Thus, a smaller or tighter pitch, $P_1$ (e.g., 30 μm) corresponds to an increased communication rate relative to a pitch of 50 μm or more. In one embodiment, contact points have a diameter on the order of 30 μm.

The inset of FIG. 1 also shows contact points 116 that, in one embodiment, have a larger diameter than contact points and a pitch, $P_2$, that is greater than a pitch, $P_1$, associated with contact points 114. In one embodiment, contact points 116 have a diameter on the order of 80 µm and a pitch, $P_2$, on the order of 130 µm. In one embodiment, contact points 116 are continuous posts or pillars of an electrically conductive material (e.g., copper or nickel) having a top or superior surface available for an electrically conductive connection with die interconnect structures 110 of dies 102. Contact points 116 are formed, in this example, on pads or traces 109 (e.g., a redistribution layer) on a surface of the substrate body under surface layer 1041. Pads or traces 109 are connected to electrically conductive vias 107 that may extend directly through package substrate 104 or to conductive traces in package substrate 104.

Figure 2:
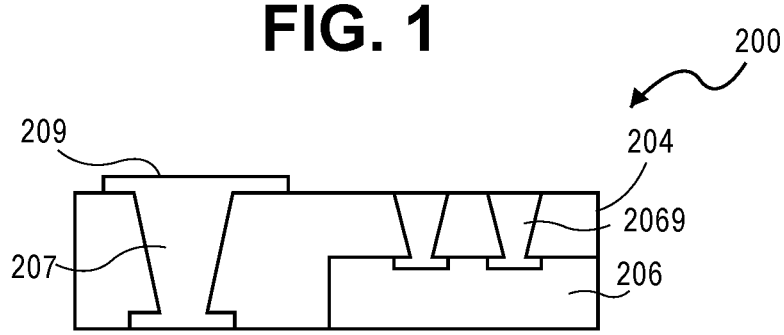
FIG. 2 shows a cross-section of a portion of a package assembly including a package substrate including an embedded bridge therein.
Figure 6:
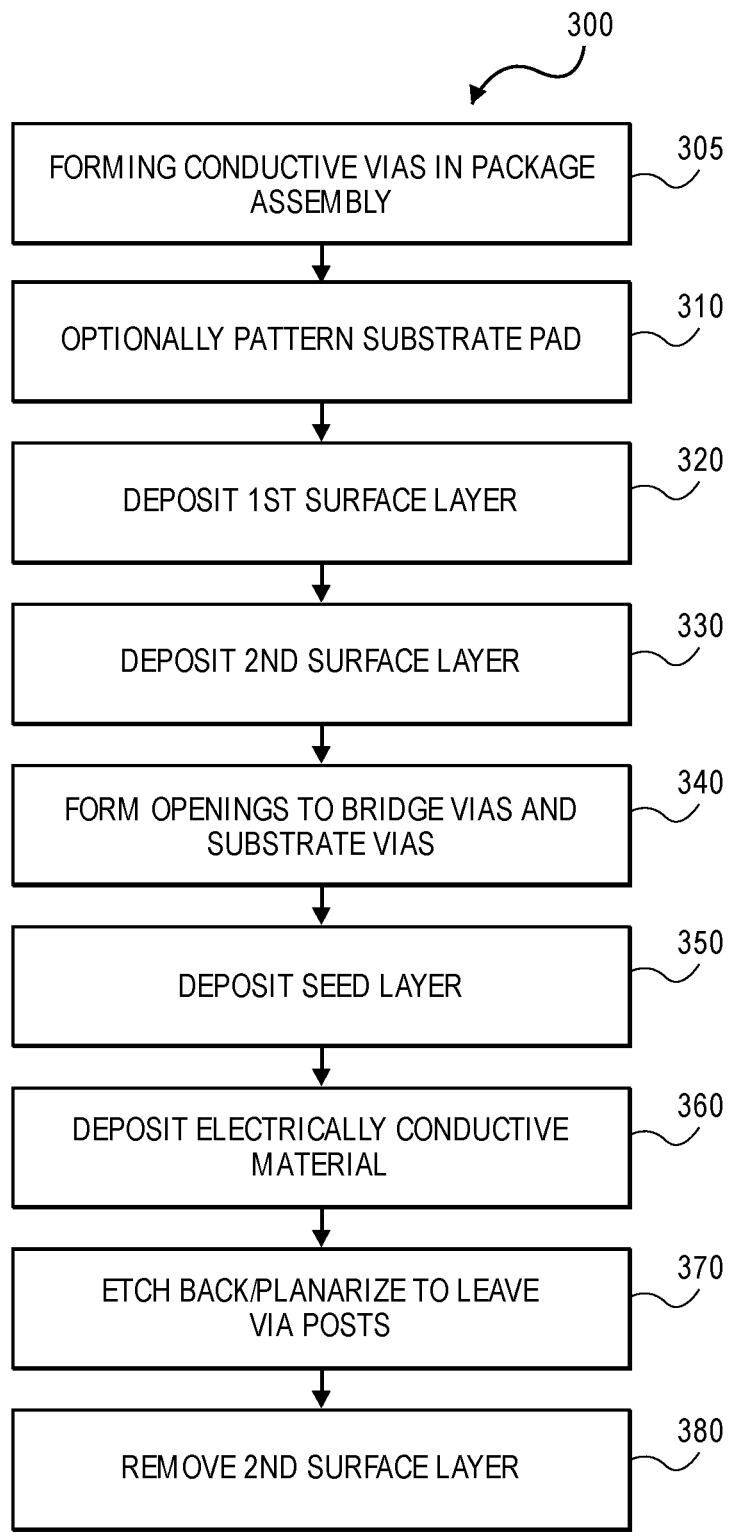
FIG. 6 shows one embodiment of a flow chart of a method of forming contact points on a package assembly.

FIGS. 2-5 describe a method of forming contact points on a package substrate (e.g., contact points 114 and contact point 116 of FIG. 1). FIG. 6 is a flow chart of a method of forming contact points. Referring to FIG. 2 and method 300 of FIG. 6, in this embodiment, the method includes forming first conductive vias in a package assembly (block 305, FIG. 6). Package assembly 200 includes package substrate 204 and at least one bridge substrate 206 embedded in the package substrate. The conductive vias include substrate conductive vias 207 to electrical routing features in package substrate 204 and bridge conductive vias 2069 to bridge surface routing features of bridge substrate 206. The conductive vias may be formed by laser drilling or lithographic etch techniques where openings are formed to expose electrical routing features in package substrate 204 and bridge surface routing features. An electrically conductive material such as copper is then deposited in the openings to form substrate conductive vias 207 and bridge conductive vias 2069. In one embodiment, the electrically conductive material is deposited by an electrodeposition process wherein the openings are first seeded with, for example, a copper seed material and then copper is deposited in the openings by electroplating. In one embodiment, a surface of package substrate 204 (a top or superior surface as viewed) is planarized following the deposition of the electrically conductive material to form substrate conductive vias 207 and bridge conductive vias 2069.

Following the formation of substrate conductive vias 207 and bridge conductive vias 2069, conductive pads 209 are optionally formed on the surface of package substrate 204 (the top or superior surface as viewed) for conductive vias 207 (block 310, FIG. 6). Conductive pads 209 may be formed by an electrodeposition process where, for example, a surface of package assembly 200 is seeded with a copper seed material, then masked with openings for the pads and any desired redistribution layer. An electrically conductive copper material is then deposited by electroplating in the openings followed by a removal of the masking material and unwanted seed material.

FIG. 3A shows the structure of FIG. 2 following the deposition of first and second surface layers on the package substrate and the forming of openings through the first and second surface layers to expose conductive pads 209 and bridge conductive vias 2069. First surface layer 2041 is deposited on a surface of package substrate 204 (block 320, FIG. 6). In one embodiment, first surface layer is a dielectric material such as solder resist or other photoimageable dielectric material. First surface layer 2041 is deposited to a thickness selected for a thickness of contact points that will be formed to conductive pads 209 and bridge conductive vias 2069. A representative thickness is on the order of 10 µm. A dielectric material such as solder resist may be deposited by a chemical vapor deposition process. In one embodiment, a blanket deposition is used to deposit first surface layer 2041 over a portion of the surface of package substrate 204 including the entire portion.

Following the deposition of first surface layer 2041, second surface layer 2042 is deposited on first surface layer 2041 (block 330, FIG. 6). Second surface layer 2042 is a material (e.g., a dielectric material) that, in one embodiment, can be selectively removed relative to first surface layer 2041. In one embodiment, second surface layer 2042 is a dry film resist material. Dry film resist may be selectively removed relative to solder resist by chemical means (e.g., with a chemical stripper) which is generally not removable by chemical means. In one embodiment, second surface layer 2042 is deposited as a blanket on first surface layer 2041 to a thickness sufficient to expose contact points formed to conductive pads 209 and bridge conductive vias 2069 when it is removed. In one embodiment, second surface layer 2042 is deposited by chemical vapor deposition to a thickness on the order of 10 µm.

Following the formation of first surface layer 2041 and second surface layer 2042 on package substrate 204, openings are formed through first surface layer 2041 and second surface layer 2042 to expose, in this embodiment, conductive pads 209 and bridge conductive vias 2069 (block 340, FIG. 6). The openings may be formed by laser drilling (laser etching) or a photolithographic process (mask and etch). FIG. 3A shows openings 220 through first surface layer 2041 and second surface layer 2042 to bridge conductive vias 2069 and opening 225 to conductive pad 209. Openings 220 and 225 are illustrated as vertical (anisotropic) with equivalent opening dimensions through each of first surface layer 2041 and second surface layer 2042 (the openings define vertical sidewalls of similar dimensions through each of first surface layer 2041 and second surface layer 2042. For an etching process, it is appreciated that the opening dimensions through each of first surface layer 2041 and second surface layer 2042 may not be the same. As noted above, in one embodiment, a material for first surface layer 2041 is different than a material for second surface layer 2042. Light utilized in an etching process, for example, tends to diffuse through material negatively or positively depending on the material and the light source. FIG. 3B and FIG. 3C show the structure with first surface layer 2041 and second surface layer 2042 having different patterning shapes for different dose sensitivities relative to the etch process. FIG. 3B shows second surface layer 2042 of, for example, dry film resist, having a slightly negative etch angle response relative to first surface layer 2041 of, for example, solder resist, so the dimension of the opening through second surface layer 2042 is less than the dimension of the opening through first surface layer 2041. FIG. 3C shows second surface layer 2042 having a slightly positive etch angle response relative to first surface layer 2041 so the dimension of the opening through second surface layer 2042 is greater than the dimension of the opening through first surface layer 2041. It is appreciated that any of the profiles produced for the openings through first surface layer 2041 and second surface layer 2042 are acceptable. In one embodiment, a profile is selected that exposes the entire surface area of bridge conductive vias 2069 or, in another embodiment, substantially the entire surface area (e.g., 75 percent or more).

FIG. 4 shows the structure of FIG. 3A (or FIG. 3B or FIG. 3C) following the deposition of an electrically conductive material on the structure. In one embodiment, an electrically conductive material is copper that is deposited by an electroplating process. According to one such process, a seed material, such as a copper seed material, is initially deposited on a surface of the structure (a superior surface as viewed) and in the openings to the bridge conductive vias 2069 and conductive pad 209 (block 350, FIG. 6). FIG. 4 representatively shows seed material 215. Following the deposition of seed material, electrically conductive material 225 such as copper is deposited by an electroplating process (block 360, FIG. 6). The copper is deposited, in one embodiment, in an amount sufficient to fill the openings to bridge conductive vias 2069 and conductive pad 209 and on the surface of the structure. In another embodiment, an electrically conductive material is nickel that may be deposited by an electroless deposition process.

FIG. 5 shows the structure of FIG. 4 following the planarizing of the surface of the structure and the removal of the second surface layer. Referring to FIG. 5, after deposition of an electrically conductive material to bridge conductive vias 2069 and conductive pad 209 and on the surface of the structure, electrically conductive material 225 such as copper or nickel is removed from the surface by an etch back or other planarization process (block 370, FIG. 6). The planarization process retains electrically conductive material 225 in the openings through first surface layer 2041 and second surface layer 2042 as, in one embodiment, continuous electrically conductive posts or pillars. In one embodiment, the electrically conductive posts or pillars have a similar surface area at the top and bottom (the bottom being in contact with bridge conductive vias 2069 or conductive pad 209 with possible seed material therebetween). In one embodiment, the electrically conductive posts or pillars have a similar surface area along the entire length of the posts or pillars.

Following the planarization of electrically conductive material 225 to define electrically conductive posts or pillars through openings in first surface layer 2041 and second surface layer 2042, second surface layer 2042 is removed (block 380, FIG. 6). In one embodiment, second surface layer 2042 is selectively removed relative to first surface layer 2041 so that first surface layer 2041 remains. Where first surface layer 2041 is solder resist and second surface layer 2042 is dry film resist, second surface layer 2042 may be selectively removed by chemical means such as with a chemical stripper. The removal of second surface layer 2042 leaves electrically conductive material 225 as electrically conductive posts or pillars exposed on the structure and available as contact points for connection to a die or other device.

Figure 7:
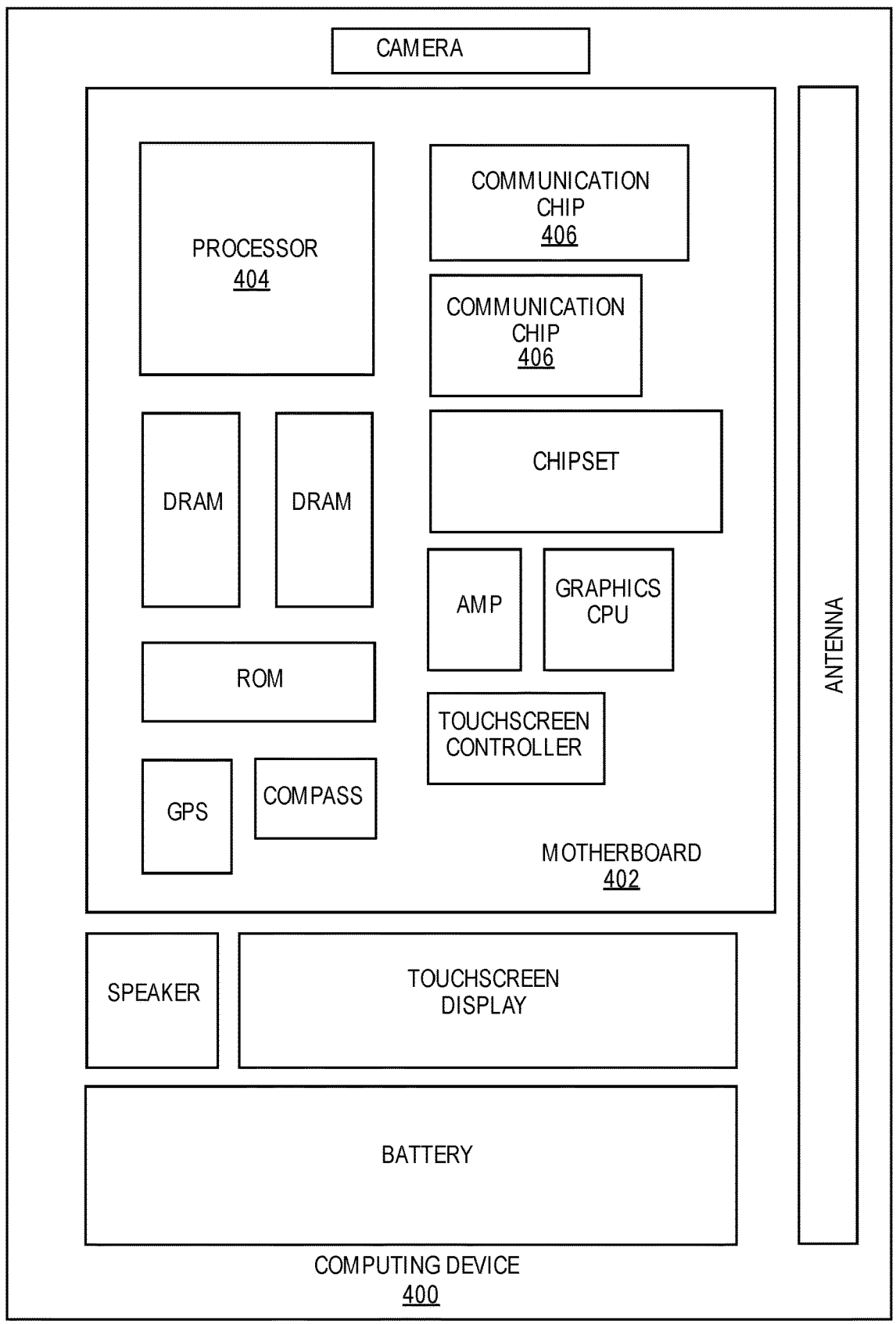
FIG. 7 illustrates an embodiment of a computing device.

FIG. 7 illustrates computing device 400 in accordance with one implementation. Computing device 400 houses board 402. Board 402 may include a number of components, including but not limited to processor 404 and at least one communication chip 406. Processor 404 is physically and electrically coupled to board 402. In some implementations at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, first communication chip 406 may be dedicated to shorter range wireless communications such as Wi-Fi and Bluetooth and second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the integrated circuit die of the processor includes one or more devices, such as transistors or metal interconnects. A package may include a package substrate such as described above with one or more embedded bridges. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, the integrated circuit die of the communication chip includes one or more devices, such as transistors or metal interconnects, that are formed in accordance with implementations.

In further implementations, another component housed within computing device 400 may contain an integrated circuit die that includes one or more devices, such as transistors or metal interconnects.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

Example 1 is a package substrate including a substrate body including electrical routing features therein and a surface layer of a dielectric material and a plurality of first contact points on the surface layer including a first pitch and a plurality of second contact points on the surface layer including a second pitch that is less than the first pitch, the plurality of first contact points and the plurality of second contact points coupled to respective ones of the electrical routing features, wherein the plurality of first contact points and the plurality of second contact points are continuous posts to the respective ones of the electrical features.

In Example 2, the electrical routing features to which respective ones of the plurality of second contact points of the package substrate of Example 1 are coupled include conductive vias beneath the surface layer.

In Example 3, the electrical routing features to which respective ones of the first plurality of first contact points of the package substrate of Example 1 or 2 are body surface routing features coupled to underlying conductive vias.

In Example 4, the continuous posts of the package substrate of any of Examples 1-3 are electroplated copper.

In Example 5, the package substrate of any of Examples 1-4 further includes at least one bridge substrate disposed in the substrate body beneath the surface layer wherein the bridge substrate includes bridge surface routing features and the conductive vias are coupled to the bridge surface routing features.

In Example 6, the bridge surface routing features of the package substrate of Example 5 are configured to route input/output electrical signals.

In Example 7, the plurality of second contact points of the package substrate of Example 5 include a pitch of 60 microns or less.

In Example 8, the plurality of second contact points of the package substrate of Example 5 include a pitch of 30 microns.

Example 9 is a package assembly including the package substrate of any of Examples 108 and a first die and a second die disposed on the surface layer of the package substrate, wherein each of the first die and the second die are coupled to respective ones of the plurality of second contact points.

Example 10 is a package assembly including a package substrate including electrical routing features therein and a surface layer of a dielectric material and a plurality of first contact points on the surface layer including a first pitch and a plurality of second contact points on the surface layer including a second pitch that is less than the first pitch; and at least one bridge substrate embedded in the package substrate, wherein the bridge substrate includes bridge surface routing features and the plurality of second contact points each include an end of a conductive via coupled at an opposite end to respective ones of the bridge surface routing features.

In Example 11, the conductive vias of the package assembly of Example 10 are electroplated copper.

In Example 12, the bridge surface routing features of the package assembly of Example 10 are configured to route input/output electrical signals.

In Example 13, the plurality of second contact points of the package assembly of Example 10 include a pitch of 60 microns or less.

In Example 14, the plurality of second contact points of the package assembly of Example 10 include a pitch of 30 microns.

In Example 15, the package assembly of Example 12 further includes a first die and a second die disposed on the surface layer of the package substrate, wherein each of the first die and the second die are coupled to respective ones of the plurality of second contact points.

Example 16 is a method of forming a package assembly including forming first conductive vias in a package assembly, the package assembly including a package substrate and at least one bridge substrate embedded in the package substrate, wherein the first conductive vias include substrate conductive vias to electrical routing features in the package substrate and bridge conductive vias to bridge surface routing features of the at least one bridge substrate; forming a first surface layer on the package substrate and on the first conductive vias; forming a second surface layer on the first surface layer; forming openings through the first surface layer and the second surface layer to expose at least the bridge conductive vias; and forming second conductive vias through each of the first surface layer and the second surface layer, wherein a first end of ones of the second conductive vias directly contact at least the bridge conductive vias.

In Example 17, the method of Example 16 further includes, after forming the second conductive vias, removing the second surface layer.

In Example 18, the second surface layer in the method of Example 16 or 17 includes a material that can be selectively removed relative to the first surface layer.

In Example 19, prior to forming the first surface layer and the second surface layer, forming substrate surface routing features to ones of the substrate conductive vias and forming the second conductive vias in the method of any of Examples 16-18 includes forming ones of the second conductive vias to the substrate surface routing features.

In Example 20, forming the second conductive vias in the method of any of Example 16-19 includes electroplating copper in the openings through the first surface layer and the second surface layer.

In Example 21, the second conductive vias in the method of any of Example 16-20 include a pitch of 30 microns.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A package substrate comprising:
a substrate body comprising electrical routing features therein and a surface layer of a dielectric material and a plurality of first contact points in the surface layer comprising a first pitch and a plurality of second contact points in the surface layer comprising a second pitch that is less than the first pitch, the plurality of first contact points having co-planar bottom surfaces and the plurality of second contact points having co-planar bottom surfaces, wherein the co-planar bottom surfaces of the plurality of first contact points are above the co-planar bottom surfaces of the plurality of second contact points, and the plurality of first contact points and the plurality of second contact points coupled to respective ones of the electrical routing features, wherein the plurality of first contact points and the plurality of second contact points are continuous posts to the respective ones of the electrical features, wherein each of the contact points of the plurality of first contact points and the plurality of second contact points has a portion extending above a corresponding opening in the surface layer, wherein each of the portions has a widest width no greater than a widest width of the corresponding opening in the surface layer, wherein the plurality of first contact points is not intervening with the plurality of second contact points, and the plurality of second contact points is not intervening with the plurality of first contact points, and wherein the plurality of first contact points is at a periphery of the substrate body, and the plurality of second contact points is within the periphery of the substrate body.

2. The package substrate of claim 1, wherein the electrical routing features to which respective ones of the plurality of second contact points are coupled comprise conductive vias beneath the surface layer.

3. The package substrate of claim 2, wherein the electrical routing features to which respective ones of the first plurality of first contact points are coupled are body surface routing features coupled to underlying conductive vias.

4. The package substrate of claim 2, wherein the continuous posts are electroplated copper.

5. The package substrate of claim 2, further comprising at least one bridge substrate disposed in the substrate body beneath the surface layer wherein the bridge substrate comprises bridge surface routing features and the conductive vias are coupled to the bridge surface routing features.

6. The package substrate of claim 5, wherein the bridge surface routing features are configured to route input/output electrical signals.

7. The package substrate of claim 5, wherein the plurality of second contact points comprise a pitch of 60 microns or less.

8. The package substrate of claim 5, wherein the plurality of second contact points comprise a pitch of 30 microns.

9. A package assembly comprising:
a package substrate comprising electrical routing features therein and a surface layer of a dielectric material and a plurality of first contact points in the surface layer comprising a first pitch and a plurality of second contact points in the surface layer comprising a second pitch that is less than the first pitch, the plurality of first contact points having co-planar bottom surfaces and the plurality of second contact points having co-planar bottom surfaces, wherein the co-planar bottom surfaces of the plurality of first contact points are non-co-planar with the co-planar bottom surfaces of the plurality of second contact points, wherein each of the contact points of the plurality of first contact points and the plurality of second contact points has a portion extending above a corresponding opening in the surface layer, wherein each of the portions has a widest width no greater than a widest width of the corresponding opening in the surface layer, and wherein the plurality of first contact points is not intervening with the plurality of second contact points, and the plurality of second contact points is not intervening with the plurality of first contact points; and at least one bridge substrate embedded in the package substrate, wherein the bridge substrate comprises bridge surface routing features and the plurality of second contact points each comprise an end of a conductive via coupled at an opposite end to respective ones of the bridge surface routing features.

10. The package assembly of claim 9, wherein the conductive vias are electroplated copper.

11. The package assembly of claim 9, wherein the bridge surface routing features are configured to route input/output electrical signals.

12. The package assembly of claim 9, wherein the plurality of second contact points comprise a pitch of 60 microns or less.

13. The package assembly of claim 9, wherein the plurality of second contact points comprise a pitch of 30 microns.

14. The package assembly of claim 11, further comprising a first die and a second die disposed on the surface layer of the package substrate, wherein each of the first die and the second die are coupled to respective ones of the plurality of second contact points.

* * * * *